United States Patent
Vervoordeldonk et al.

(10) Patent No.: US 8,885,147 B2
(45) Date of Patent: Nov. 11, 2014

(54) LITHOGRAPHIC APPARATUS AND DEVICE MANUFACTURING METHOD

(75) Inventors: Michael Johannes Vervoordeldonk, Rosmalen (NL); Ronald Casper Kunst, Geldrop (NL); Youssef Karel Maria De Vos, Lille (BE); Johannes Hubertus Antonius Van De Rijdt, Gemert (NL); Robertus Jacobus Theodorus Van Kempen, Boekel (NL)

(73) Assignee: ASML Netherlands B.V., Veldhoven (NL)

( * ) Notice: Subject to any disclaimer, the term of this patent is extended or adjusted under 35 U.S.C. 154(b) by 804 days.

(21) Appl. No.: 12/699,544

(22) Filed: Feb. 3, 2010

(65) Prior Publication Data
US 2010/0214548 A1    Aug. 26, 2010

Related U.S. Application Data

(60) Provisional application No. 61/155,019, filed on Feb. 24, 2009.

(51) Int. Cl.
G03B 27/58    (2006.01)
G03F 7/20    (2006.01)

(52) U.S. Cl.
CPC ........ *G03F 7/70758* (2013.01); *G03F 7/70783* (2013.01)
USPC .......................................................... 355/72

(58) Field of Classification Search
CPC ......................... G03F 7/70783; G03F 7/70758
USPC ........................................ 355/72, 75; 318/10
See application file for complete search history.

(56) References Cited

U.S. PATENT DOCUMENTS

| | | |
|---|---|---|
| 7,327,437 B2 | 2/2008 | Cox et al. |
| 7,456,527 B2 | 11/2008 | Cuijpers |

(Continued)

FOREIGN PATENT DOCUMENTS

| | | |
|---|---|---|
| EP | 1647861 A1 | 4/2006 |
| JP | 1-219592 A | 9/1989 |

(Continued)

OTHER PUBLICATIONS

Japanese Office Action mailed May 30, 2012 in corresponding Japanese Patent Application No. 2010-031893.

(Continued)

*Primary Examiner* — Peter B Kim
(74) *Attorney, Agent, or Firm* — Pillsbury Winthrop Shaw Pittman LLP

(57) ABSTRACT

A lithographic apparatus includes a support constructed to support a patterning device, the patterning device being capable of imparting a radiation beam with a pattern in its cross-section to form a patterned radiation beam; a substrate table constructed to hold a substrate on a central area; and a projection system configured to project the patterned radiation beam onto a target portion of the substrate in a first direction. The apparatus further includes a positioning device to position the substrate table, wherein the positioning device includes a plurality of actuators arranged to, in use, exert forces to position the substrate table, the forces substantially being directed in a plane substantially perpendicular to the first direction and wherein the plurality of actuators are arranged outside a central volume of the substrate table, the central volume being obtained by projecting the central area along the first direction.

20 Claims, 5 Drawing Sheets

(56) References Cited

U.S. PATENT DOCUMENTS

| | | |
|---|---|---|
| 7,742,149 B2 | 6/2010 | De Vos et al. |
| 2001/0013927 A1* | 8/2001 | Itoh et al. ............... 355/53 |
| 2005/0195381 A1 | 9/2005 | Cuijpers |
| 2006/0114445 A1* | 6/2006 | Ebihara ................... 355/72 |
| 2006/0119829 A1 | 6/2006 | Cox et al. |
| 2007/0252970 A1* | 11/2007 | Shibazaki ............... 355/72 |
| 2008/0285004 A1* | 11/2008 | Binnard et al. ......... 355/72 |
| 2008/0309911 A1 | 12/2008 | De Vos et al. |

FOREIGN PATENT DOCUMENTS

| | | |
|---|---|---|
| JP | 11-194824 | 7/1999 |
| JP | 2003-022960 | 1/2003 |
| JP | 2005-286321 | 10/2005 |
| JP | 2005-297109 | 10/2005 |
| JP | 2006-165564 | 6/2006 |
| JP | 2006-210659 | 8/2006 |
| JP | 2008-172137 | 7/2008 |
| JP | 2008-300828 | 12/2008 |
| KR | 10-2006-0052181 A | 5/2006 |
| TW | 200625504 | 7/2006 |
| TW | 200900885 | 1/2009 |

OTHER PUBLICATIONS

Office Action in related Korean patent application No. 10-2010-0016535 mailed May 18, 2011.

* cited by examiner

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/155,019, entitled "Lithographic Apparatus and Device Manufacturing Method", filed on Feb. 24, 2009. The content of that application is incorporated herein in its entirety by reference.

FIELD

The present invention relates to a lithographic apparatus and a positioning assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure that a target portion of the patterning device is projected on the appropriate position on the substrate during the scanning of the pattern, an accurate positioning of the substrate relative to the patterning device is desirable. Accurate positioning of the patterning device and substrate is, is in general, achieved by the application of a plurality of electromagnetic actuators and motors. At the same time, it is desirable for a lithographic apparatus to realize a high throughput, i.e. the number of wafers processed over a given time should be as high as possible. In order to achieve a high throughput, a high scanning velocity is preferred. Achieving a high scanning velocity requires the application of high acceleration and deceleration forces. Known positioning devices of lithographic apparatuses include an actuator assembly to provide an accurate positioning of the substrate table. Such an actuator assembly is in general arranged below the substrate table. It has been observed that such an arrangement of an actuator assembly may result in unwanted deformations or displacements of the substrate table during the operation of the positioning device thereby adversely affecting the accurate positioning of the substrate table. In order to avoid such unwanted deformations or displacements, complex control strategies or additional actuators may be required.

SUMMARY

It is desirable to provide a positioning device for a lithographic apparatus that enables a more accurate positioning of a substrate processed by the lithographic apparatus.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate on a central area; a projection system configured to project the patterned radiation beam onto a target portion of the substrate in a first direction, and a positioning device to position the substrate table, wherein the positioning device includes a plurality of actuators arranged to, in use, exert forces to position the substrate table, the forces substantially being directed in a plane substantially perpendicular to the first direction and wherein the plurality of actuators are arranged outside a central volume of the substrate table, the central volume being obtained by projecting the central area along the first direction.

The lithographic apparatus according to an embodiment of the invention includes a plurality of actuators, also referred to as an actuator assembly, the plurality of actuators being arranged to exert forces to position the substrate table. The actuator forces generated by the actuator assembly have an orientation which can be described by plane substantially perpendicular to a first direction, the first direction corresponding to the projection direction of the patterned radiation beam onto the substrate. The plurality of actuators of the actuator assembly are further arranged outside a central volume of the substrate table, the central volume being obtained by projecting a central area of the substrate table intended for holding the substrate, along the first direction. It has been devised by the inventors that such an arrangement enables an improved positional accuracy of the substrate table.

Positioning devices for positioning a substrate table that include an actuator assembly are known whereby the actuator assembly has been provided underneath the substrate and substrate table. Such an arrangement can, however, present a drawback with respect to the positional accuracy as can be obtained. By arranging the actuator assembly below the substrate table, exerting the actuator forces to the substrate table in a direction substantially perpendicular to the projection direction would not only result in a linear displacement but also in a rotation because of the positioning of the actuators below the center of gravity of the substrate table. In general, such a rotation is undesired in case of a displacement of a substrate table of a lithographic apparatus. Therefore, in order to avoid such a rotation, additional actuators generating a compensating torque that counteracts the rotation would be required. It will be acknowledged by the skilled person that the application of additional actuators to counteract a rotation of the substrate table could excite certain vibrational modes of the substrate table. In order to reduce the required compensating torque, it has been suggested in US 2006/0119829 to arrange the actuator assembly at least partly inside a cavity of the substrate table below the substrate in order to mount the actuator assembly closer to the center of gravity of the substrate table. By providing the actuator assembly partly inside the substrate table, the plane described by the direction of the actuator forces is brought closer to the plane including the center of gravity of the substrate table. As such, the required compensating torques (as described above) can be reduced. However, mounting the actuator assembly partly inside the substrate table affects the structural stiffness of the substrate table. By providing the actuator assembly partly inside the mirror block, the structural stiffness of the substrate table can be compromised. Due to the presence of the actuator assembly partly inside the substrate table, the possibilities of enhancing the stiffness are limited. As such, unwanted deformations or displacements of the substrate table may still occur. Therefore, by arranging the actuator assembly outside the central volume as defined, the structural stiffness of the substrate table is no longer compromised, thus enabling an improved positional accuracy. By arranging the actuator assembly outside the central volume of the substrate table rather than below the substrate (either outside or partly inside the substrate table), designing a substrate table having the preferred mechanical characteristics (stiffness, eigenfrequencies, etc.) is facilitated.

In a lithographic apparatus according to an embodiment of the invention, the central volume of the substrate table is provided with one or more enforcement ribs thereby improving the stiffness of the substrate table which may result in an increase of the eigenfrequencies of the table. As known to the skilled person, increasing the stiffness or eigenfrequencies may facilitate a more accurate positioning of the table. Due to increased eigenfrequencies, a controller controlling the actuators that position the substrate table may e.g. operate at a higher bandwidth in case the eigenfrequencies of the table are increased.

In a lithographic apparatus according to an embodiment of the invention, a further improvement is obtained by arranging the actuators to exert forces in a plane that includes a center of gravity of the substrate table. By doing so, displacements of the substrate table in a direction that is substantially parallel to the plane (i.e. displacements in a direction perpendicular to the projection direction) can be realized with minimal deformations of the substrate table. By arranging the actuators in such manner that the actuator forces do not, or hardly, cause rotation of the substrate table, a more accurate positioning of the substrate table can be realized because no compensating torques need to be generated, the compensating torques potentially affecting the positional accuracy. Disturbances in the actuator forces will therefore result in smaller unwanted rotations of the substrate table.

In an embodiment, the actuator assembly includes four actuators arranged along four sides of the substrate table. In general, a substrate table has a substantially rectangular shape. Such a substrate table has a substantially rectangular upper surface including the central area that is arranged to receive a wafer or substrate. The central area can e.g. be provided with a burl table. On the upper surface of the substrate table, along the circumference of the central area, sensors can be positioned, e.g. to facilitate the position measurement of a substrate mounted to the table.

In general, positioning of a substrate table in a lithographic apparatus is realized by applying electromagnetic actuators including a coil (including one or more Cu or Al windings) and a magnet member, e.g. including a permanent magnet and optionally a magnetic yoke (e.g. including Fe or CoFe). It is however worth noting that other types of actuators can be applied as well. Such actuators include but are not limited to reluctance actuators and piezo-actuators.

In order to provide accurate positioning of the substrate table over comparatively large distances (>0.5 meter), the positioning device of a lithographic apparatus according to an embodiment of the invention further includes an electromagnetic motor configured to provide a long stroke positioning of the substrate table and the actuator assembly. Examples of such electromagnetic motor include, but are not limited to, planar motors and cascaded arrangements of linear motors, also known as H-drives. In such an arrangement, the actuator assembly can be mounted to the electromagnetic motor.

In an embodiment, an actuator of the actuator assembly includes a coil member and a magnet member, in use, co-operating with the coil member to in use, exert a force to position the substrate table. Preferably, the magnet member of the actuator is mounted to the substrate table while the coil member is e.g. mounted to an electromagnetic motor of the positioning device that enables a long stroke positioning. By doing so, wiring of the actuator (e.g. for powering the coil member) does not have to be connected to the substrate table, thereby substantially avoiding disturbances to the substrate table.

In an embodiment, the magnet member mounted to the substrate table includes a plurality of substantially independent magnet sub-members, the magnet sub-members, in use, co-operating with a coil of the coil member. It has been observed by the inventors that by subdividing a magnet member of an electromagnetic actuator into multiple sub-members and mounting the sub-members independently to the table, thermal stresses induced in the substrate table by the magnet member, can be mitigated.

The above described positioning system or assembly (including the substrate table and the positioning device) may also be applied in other fields where accurate positioning of an object is desired. Therefore, according to another aspect of the invention, there is provided a positioning assembly for positioning an object, the positioning assembly including an object table constructed to hold the object on a central area; a plurality of actuators arranged to, in use, exert forces to position the object table, the forces substantially being directed in a plane substantially parallel to a plane including the central area and wherein the plurality of actuators are arranged outside a central volume of the object table, the central volume being obtained by projecting the central area along a direction substantially perpendicular to the plane.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
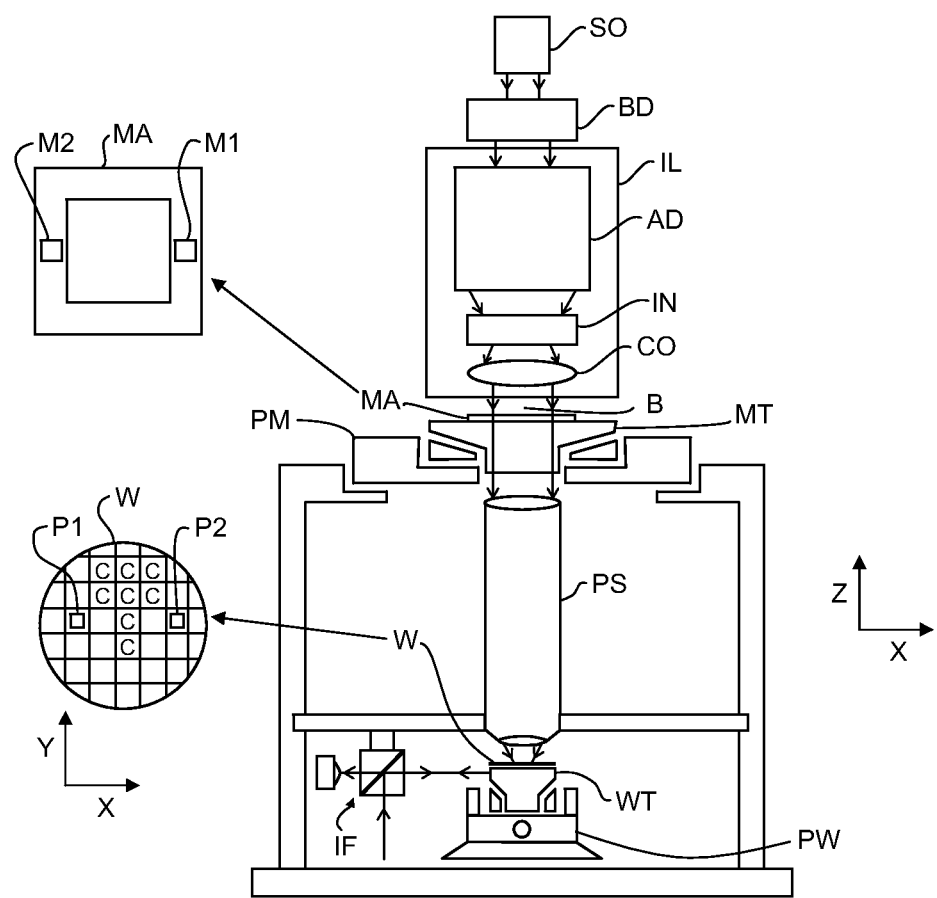
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support or support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. The second positioner PW combined with the substrate table WT can e.g. correspond to the positioning assembly according to an embodiment of the invention whereby the object table corresponds to the substrate table WT and the object to be positioned corresponds to the substrate. The plurality of actuators of the positioning assembly can perform the role the short-stroke module and provide accurate positioning of the substrate table WT. In the lithographic apparatus according to an embodiment of the invention, the substrate table is constructed to hold a substrate or wafer on a central area. The plurality of actuators of the positioning assembly are arranged to, in use, exert forces to position the substrate table, the forces substantially being directed in a plane substantially parallel to a plane including the central area and wherein the plurality of actuators are arranged outside a central volume of the substrate table, the central volume being obtained by projecting the central area along a direction substantially perpendicular to the plane, the direction substantially corresponding to direction wherein the patterned radiation beam is projected onto a target portion of the substrate. By arranging the plurality of actuators outside the central volume of the substrate table rather than e.g. below the substrate (either outside or partly inside the substrate table), designing a substrate table having the preferred mechanical characteristics (stiffness, eigenfrequencies, etc.) is facilitated.

As an example, the central volume of the substrate table can be provided with one or more enforcement ribs thereby improving the stiffness of the substrate table which may result in an increase of the eigenfrequencies of the table. As known to the skilled person, increasing the stiffness or eigenfrequencies may facilitate a more accurate positioning of the table. Due to increased eigenfrequencies, a controller controlling the actuators that position the substrate table may e.g. operate at a higher bandwidth in case the eigenfrequencies of the table are increased.

In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
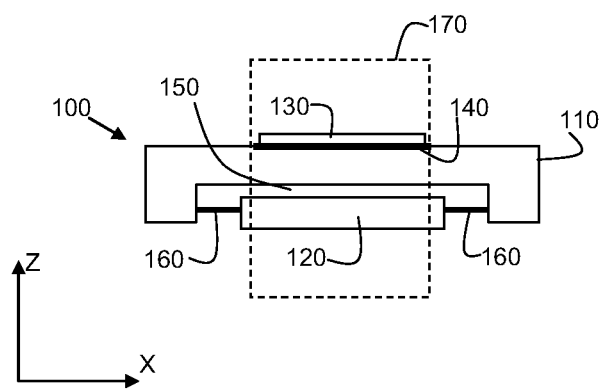
FIG. 2 schematically depicts a cross-sectional view of positioning assembly known in the art.

FIG. 2 schematically depicts part of a known positioning assembly 100 as can be applied in a lithographic apparatus. FIG. 2 schematically depicts an XZ cross-sectional view of the positioning assembly, the assembly including a substrate table 110 (in general, an object table) and a positioning device including an actuator assembly 120 including a plurality of actuators (not shown). The substrate table or object table 110 is arranged to receive a substrate 130 (in general, an object) on a central area 140 of the table. As shown, the actuator assembly 120 is arranged substantially below the central area 140 of the substrate table 110; and partly arranged inside a cavity 150 of the substrate table 110. The actuator assembly 120 e.g. being mounted to the substrate table using leaf springs 160. Such leaf springs may help in avoiding thermal stresses introduced in the substrate table by the actuators. However, the application of such leaf springs 160 may result in a decoupling of the actuator assembly 120 and the substrate table 110 above a certain frequency. As such, the application of such leaf springs may affect the achievable bandwidth of the forces controlling the positioning of the substrate table.

As can be seen in FIG. 2, the actuator assembly 120 is at least partly arranged in a central volume of the positioning assembly 100, the volume being obtained by projecting the central area 140 of the substrate table along the Z-direction (the Z-direction e.g. corresponding to the direction of a projection of a patterned radiation beam onto a target portion of the substrate 130), and indicated in FIG. 2 by the dotted line 170.

Figure 3:
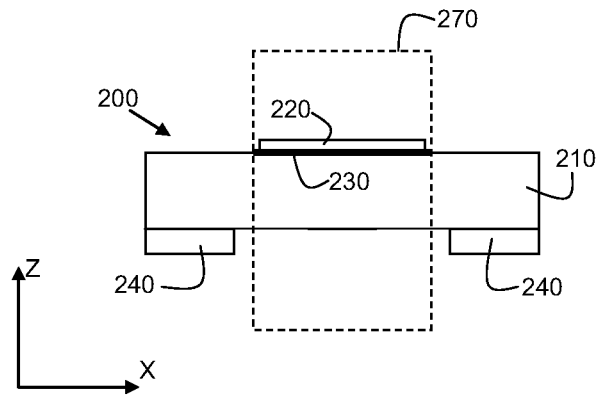
FIG. 3 schematically depicts a positioning assembly according to an embodiment of the present invention.

In accordance with an embodiment of the invention, a positioning assembly for e.g. positioning a substrate in a lithographic apparatus includes a positioning device having a plurality of actuators (also referred to as an actuator assembly) arranged outside the central volume as described in FIG. 2. FIG. 3 schematically a possible arrangement of such plurality of actuators in a positioning assembly according to an embodiment of the invention.

FIG. 3 schematically depicts an XZ cross-sectional view of a positioning assembly according to an embodiment of the invention which may be applied in a lithographic apparatus, the plurality of actuators being arranged to exert forces to the substrate table, the forces being directed in the XY-plane (the Y-direction being substantially perpendicular to the XZ-plane). The positioning assembly 200 includes a substrate table 210 arranged to receive a substrate 220 on a central area 230 of the substrate table 210. The central area 230 can e.g. correspond to the area covered by a substrate when the substrate is mounted to the substrate table. In order to position the substrate table, the positioning assembly further includes a positioning device including a plurality of actuators 240 arranged outside the central volume of the positioning assembly 200 as defined by projection of the central area 230 along the Z-direction (the Z-direction e.g. corresponding to the direction of a projection of a patterned radiation beam onto a target portion of the substrate 220), the central volume being indicated by the dotted line 270. The actuators as shown are arranged to position the substrate in the XY-plane by exerting forces directed in the plane. By arranging the plurality of actuators outside the central volume rather than below the substrate (e.g. partly inside the substrate table), designing a positioning assembly having the preferred mechanical characteristics (stiffness, eigenfrequencies, etc.) is facilitated. As will be clear to the skilled person, arranging an actuator assembly partly inside the substrate table (as e.g. shown in FIG. 2) may decrease the stiffness of the substrate table. By arranging the actuators outside the central volume, a designer has more freedom to develop a substrate table (in general, an object table) having a desired stiffness.

As an example, the central volume of the substrate table can be provided with one or more enforcement ribs thereby improving the stiffness of the substrate table which may result in an increase of the eigenfrequencies of the table. With respect to the application of enforcement ribs, the following is worth noting: In order to provide sufficient stiffness to a substrate table, it has been proposed to apply a lid at the bottom of the substrate table whereby the lid can be applied for mounting the actuator assembly. The lid can e.g. be applied to the substrate table by gluing or by bolds. It has been observed by the inventors that such an arrangement may be susceptible to creep which may compromise an accurate positioning of the substrate table. As such, it has been devised by the inventors that the application of enforcement ribs is preferred over the application of a lid closing a bottom surface of the substrate table. The arrangement of the plurality of actuators as proposed in an embodiment of the present invention, facilitates the application of such ribs. As an example, a triangular rib structure can be applied within the central volume 270 of the positioning assembly to improve the stiffness. Further, it can be noted that arranging the plurality of actuators outside the central volume as defined, can result in an increased rotational inertia of the substrate table and actuator parts mounted to the substrate table. Increasing the rotational inertia can be beneficial to improve the positional accuracy of the positioning assembly. Due to an increased rotational inertia, disturbances such as high frequency disturbance forces may result in a reduction of unwanted rotational displacements of the substrate table. It is worth noting that by positioning the plurality of actuators outside the central volume, the translational inertia can remain substantially unaffected if the same actuators are used. As known to the skilled person, increasing the stiffness or eigenfrequencies may facilitate a more accurate positioning of the table. Due to increased eigenfrequencies, a controller controlling the actuators that position the substrate table may e.g. operate at a higher bandwidth in case the eigenfrequencies of the table are increased.

Figure 4:
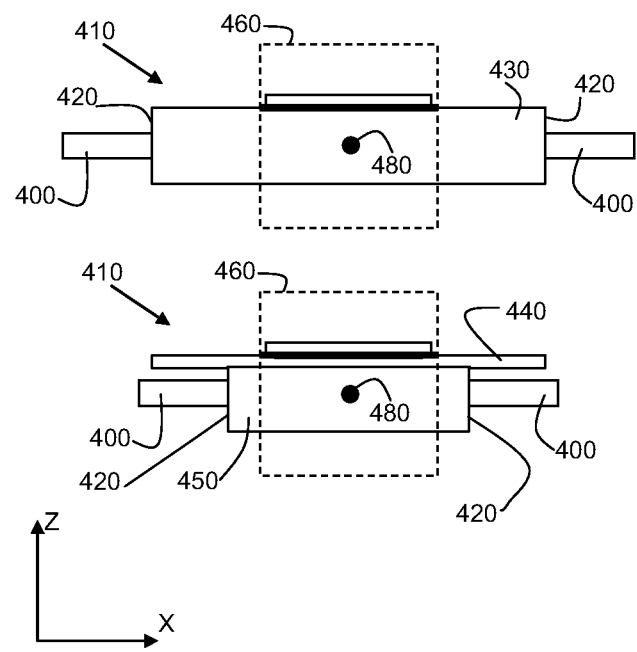
FIG. 4 schematically depicts two positioning assemblies according to embodiments of the present invention.

FIG. 4 schematically depicts two alternative arrangements of the plurality of actuators of the positioning assembly according to embodiments of the invention, the actuators being arranged to exert forces in the XY-plane. In the arrangement as shown in the top part of FIG. 4, the plurality of actuators 400 of the positioning assembly 410 are arranged along outer surfaces 420 of the substrate table 430 of the assembly 410. The actuators 400 are arranged outside a central volume of the positioning assembly 410, indicated by the dotted line 460. In the arrangement as shown in the bottom part of FIG. 4, the substrate table can e.g. be assembled by mounting a cover plate 440 to a box shaped volume 450. Outer surfaces 420 of the box shaped volume 450 can e.g. be arranged outside the central volume of the positioning assembly (indicated by the dotted line 460) and arranged to receive the actuators 400. As the actuators are thus arranged outside the volume 450, the volume can be provided with one or more enforcement ribs in order to provide the substrate table with a desired structural stiffness an correspondingly, with desired values for the eigenfrequencies of the substrate table. As an example, a triangular rib structure can be applied within the central volume 460 of the positioning assembly to improve the stiffness.

Preferably, the substrate table as applied in the positioning assembly according to an embodiment of the invention is made from or includes a low thermal expansion material such a Zerodur. In the arrangements as shown in FIG. 4, the plurality of actuators are arranged in such manner that the actuator forces are exerted in an XY-plane including the center of gravity 480 of the substrate table 430. By doing so, displacements of the substrate table in a direction that is parallel to the plane (i.e. displacements in a direction perpendicular to the projection direction) can be realized with minimal deformations of the substrate table 430. This can be explained as follows: By arranging the actuator assembly below the substrate table, as e.g. indicated in the known positioning assembly shown in FIG. 2, exerting the actuator forces to the substrate table in the XY-plane (i.e. a direction substantially perpendicular to the Z-direction (e.g. the projection direction in case the positioning assembly is used in a lithographic apparatus)) would not only result in a linear displacement but also in a rotation because of the positioning of the actuators below the center of gravity of the substrate table. In general, such a rotation is undesired in case of a displacement of a substrate table of a lithographic apparatus. Therefore, in order to avoid such a rotation, additional actuators generating a compensating torque that counteracts the rotation would be required. It will be acknowledged by the skilled person that the application of additional actuators to counteract a rotation of the substrate table could excite certain vibrational modes of the substrate table. By arranging the actuators in such manner that the actuator forces do not, or hardly, cause rotation of the substrate table, a more accurate positioning of the substrate table can be realized because no compensating torques need to be generated, the compensating torques potentially affecting the positional accuracy.

Figure 5:
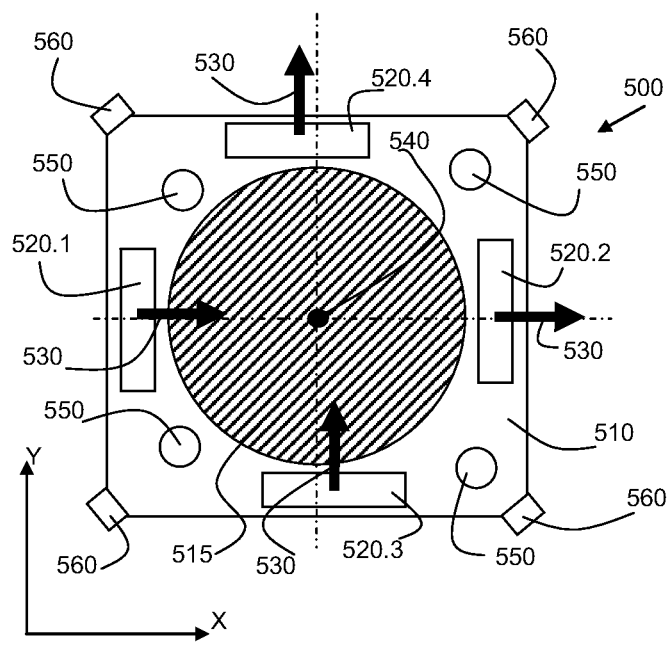
FIG. 5 schematically depicts and XY view on a positioning assembly according to an embodiment of the invention.

FIG. 5 schematically depicts and XY-view of a positioning assembly 500 according to an embodiment of the invention as can be applied in a lithographic apparatus. As shown, the positioning assembly 500 includes a substrate table 510 arranged to receive a substrate on a central area 515 of the substrate table. The assembly 500 further includes a positioning device including four actuators 520.1, 520.2, 520.3, 520.4 arranged along four sides of the substrate table. The actuators are arranged outside a central volume obtained by projecting the central area 515 in the Z-direction, perpendicular to the XY-plane including the central area 515. The pair of actuators 520.1 and 520.2 is arranged to generate forces substantially directed in the X-direction whereas the pair of actuators 520.3 and 520.4 is arranged to generate forces substantially directed in the Y-direction, the X- and Y-direction forming a plane substantially parallel to the central area 515. As can be seen in FIG. 5, as indicated by the arrows 530 indicating the direction of the forces generated by the actuators, the actuator forces can either be directed through the center of gravity 540 of the substrate table or not. The direction of the forces generated by the actuators 520.3 and 520.4 are e.g. not directed through the center of gravity 540. By doing so, a rotation of the substrate table about the Z-axis (the Z-axis being perpendicular to the XY-plane) can be realized in case the actuators 520.3 and 520.4 generate forces of a different amplitude. It is worth noting that the plurality of actuators as arranged in a positioning assembly according to an embodiment of the invention or in a lithographic apparatus according to an embodiment of the invention (i.e. arranged outside the central volume of the substrate table, e.g. along outer surfaces of the substrate table) further improves the accessibility of the actuators and may facilitate assembling the actuators to the substrate table. Compared to actuator assemblies including e.g. three actuators for generating forces in an XY-plane, the actuator forces being substantially directed 120 degrees apart, the arrangement as shown in FIG. 5 whereby the forces of actuators 520.1 and 520.2 are substantially perpendicular to the forces of actuators 520.3 and 520.4, may result in a reduced crosstalk between the actuators. FIG. 5 further indicates four additional actuators 550 arranged near the corners of the substrate table, the actuators being arranged to generate forces substantially along the Z-direction. Such actuators can e.g. be applied for positioning the substrate table along the Z-direction and/or tilting the substrate table about the X- or Y-direction. Such actuators can e.g. be so-called voice-coil motors.

In case the positioning assembly according to an embodiment of the invention is applied in a lithographic apparatus for positioning a substrate, accurate positioning of the substrate table is desired. In a preferred embodiment of the present invention, the lithographic apparatus includes a 2D encoder based measurement system to determine a position of the substrate table. Such an encoder based measurement system can e.g. include a plurality of sensors co-operating with a 2-dimensional grating. Preferable, the sensors are mounted to the substrate table. In FIG. 5, four sensors 560 are schematically indicated arranged near the corners of the substrate table 510. It will be acknowledged that other positions of the sensors or different sensor configurations are also feasible. The 2-dimensional grating can e.g. be mounted to a dynamically isolated frame or component of the lithographic apparatus. As an example, the grating can be mounted to the projection system of the lithographic apparatus. As in a lithographic apparatus, the required displacements of a substrate table can be substantial (a substrate table can e.g. be required to cover an area of 0.5×1.5 meter), it may be beneficial to subdivide the 2-dimensional grating into different smaller gratings arranged adjacent to each other.

The plurality of actuators as applied in the positioning assembly according to an embodiment of the invention can e.g. be electromagnetic actuators including a coil member and a magnet member arranged to co-operate with the coil member to generate a force in a predetermined direction. Such actuators are often applied to provide accurate positioning over comparatively small distances. In order to provide accurate positioning of the substrate table over comparatively large distances (>0.5 meter), the positioning device of the positioning assembly according to an embodiment of the invention further includes an electromagnetic motor to provide a long stroke positioning of the substrate table and the plurality of actuators. Examples of such an electromagnetic motor include but are not limited to planar motors and cascaded arrangements of linear motors, also known as H-drives. In such an arrangement, the plurality of actuators can be mounted to the electromagnetic motor.

In an embodiment the magnet members of the electromagnetic actuators are mounted to the substrate table of the positioning assembly whereas the coil members are e.g. mounted to an electromagnetic motor of the positioning device. By doing so, no electrical wiring for powering the coil members needs to be provided to the substrate table. Disturbances due to such wiring may thus be avoided.

Figure 6:
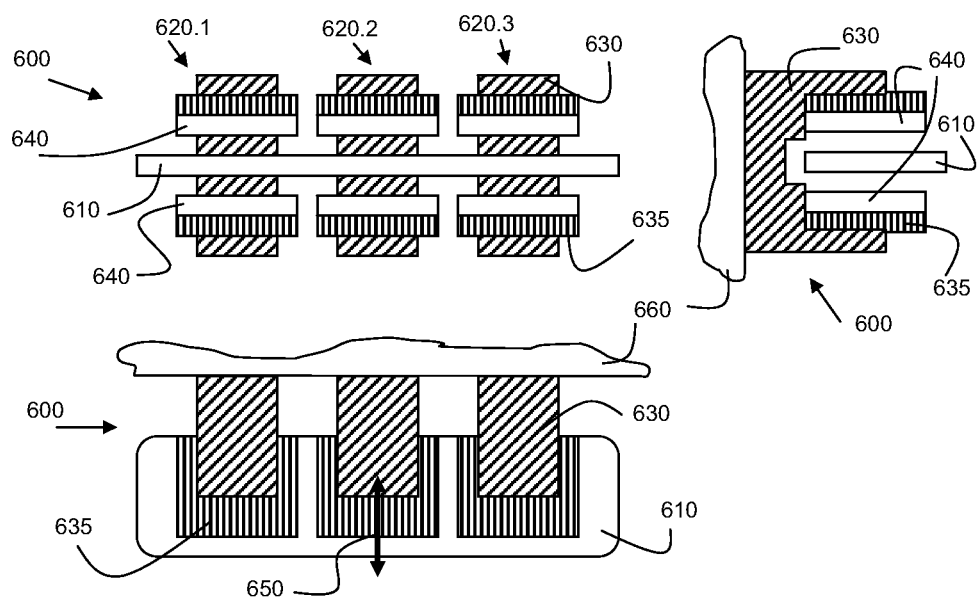
FIG. 6 schematically depicts an actuator as can be applied in a lithographic apparatus according to an embodiment of the invention or a positioning assembly according to an embodiment of the invention.

In an embodiment of the present invention, the magnet members mounted to the substrate table include a plurality of substantially independent magnet sub-members, the magnet sub-members, in use, co-operating with a coil of the coil member. It has been observed by the inventors that by subdividing a magnet member of an electromagnetic actuator into multiple sub-members and mounting the sub-members independently to the table, thermal stresses induced in the substrate table by the magnet member, can be mitigated. FIG. 6 schematically depicts three cross-sectional views of such an actuator. The actuator 600 includes a coil member 610 and a magnet member 620 including three sub-members 620.1, 620.2 and 620.3. Each sub-member is provided with a non magnetic frame 630, a back-iron 635 and a pair of permanent magnets 640. The back-iron 635 can e.g. be made or include a ferromagnetic steel or CoFe. The magnet sub-members are arranged to co-operate with the coil member 610 to generate a force in the direction as indicated by the arrow 650. The magnetic sub-members can be mounted to a substrate table 660 or object table substantially independent of each other. As such, the introduction of thermal stresses in the substrate table 660 can be mitigated. In such an arrangement, the application of leaf springs (as e.g. applied in the known construction illustrated in FIG. 2), can be avoided thereby enabling an assembly having an improved stiffness. As an example, the magnetic sub-members can be glued to the substrate table, e.g. an outer surface of the substrate table. The coil member 610 can e.g. include a single Cu or Al wound coil arranged to co-operate with the different magnetic sub-members to generate a resulting force as indicated by the arrow 650.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a substrate table constructed to hold a substrate on a central area of the substrate table;
    a projection system configured to project the patterned radiation beam onto a target portion of the substrate in a first direction; and
    a positioning device configured to position the substrate table, the positioning device comprising a plurality of actuators arranged to exert forces to position the substrate table, each of the forces generated by four of the plurality of actuators, arranged along four different sides of the substrate table, substantially being directed in a same plane substantially perpendicular to the first direction, wherein the plurality of actuators are arranged outside a central volume of the substrate table, the central volume being obtained by projecting the central area along the first direction, wherein the plurality of actuators are arranged along the four sides of the substrate table, and wherein two of the plurality of actuators arranged on two opposite sides of the substrate table are configured to exert a force in a same direction that passes substantially through a center of gravity of said substrate table and wherein another two of the plurality of actuators arranged on another two opposite sides of the substrate table are configured to exert forces along two different directions that are parallel to each other and that do not pass through the center of gravity.

2. The lithographic apparatus of claim 1, wherein the central volume contains no actuator.

3. The lithographic apparatus of claim 1, wherein the central area substantially corresponds to an area, in use, covered by the substrate.

4. The lithographic apparatus of claim 1, wherein the plane comprises the center of gravity of the substrate table.

5. The lithographic apparatus of claim 1, wherein the positioning device further comprises an electromagnetic motor configured to provide a long stroke positioning of the substrate table and the plurality of actuators.

6. The lithographic apparatus of claim 1, wherein the plurality of actuators comprises four electromagnetic.

7. The lithographic apparatus of claim 6, wherein the four electromagnetic actuators comprise two actuators configured to exert a force in a second direction onto the substrate table, the second direction being substantially perpendicular to the first direction, the two actuators being arranged on opposite sides of the substrate table, and two further actuators configured to exert a force in a third direction substantially perpendicular to the first and the second direction, the two further actuators being arranged on opposite sides of the substrate table.

8. The lithographic apparatus of claim 1, wherein the plurality of actuators further comprises a further plurality of actuators arranged to, in use, exert forces to position the substrate table, the forces exerted by the further plurality of actuators being substantially directed perpendicular to the plane.

9. The lithographic apparatus of claim 1, wherein the substrate table is made from a low thermal expansion material.

10. The lithographic apparatus of claim 1, wherein each actuator of the plurality of actuators comprises a coil member and a magnet member that, in use, co-operates with the coil member to exert a force to position the substrate table.

11. The lithographic apparatus of claim 10, wherein the magnet members of the plurality of actuators are mounted to the substrate table.

12. The lithographic apparatus of claim 10, wherein the magnet member comprises a plurality of substantially independent magnet sub-members, the magnet sub-members being configured to, in use, co-operate with a coil of the coil member.

13. The lithographic apparatus of claim 1, wherein the central volume of the substrate table comprises one or more enforcement ribs.

14. A positioning assembly configured to position an object, the positioning assembly comprising:
    an object table constructed to hold the object on a central area of the object table;
    a positioning device comprising a plurality of actuators arranged to, in use, exert forces to position the object table, each of the forces generated by four of the plurality of actuators, arranged along four different sides of the object table, being substantially directed in a first plane substantially parallel to a second plane comprising the central area and wherein the plurality of actuators are arranged outside a central volume of the positioning assembly, the central volume being obtained by projecting the central area along a direction substantially perpendicular to the second plane, wherein the plurality of actuators are arranged along the four sides of the object table, and wherein two of the plurality of actuators arranged on two opposite sides of the object table are configured to exert a force in a same direction that passes substantially through a center of gravity of said object table and wherein another two of the plurality of actuators arranged on another two opposite sides of the object table are configured to exert forces along two different directions that are parallel to each other and that do not pass through the center of gravity.

15. The positioning assembly of claim 14, wherein the central volume contains no actuator.

16. The positioning assembly of claim 14, wherein the first plane comprises a center of gravity of the object table.

17. The positioning assembly of claim 14, wherein the positioning device further comprises an electromagnetic motor configured to provide a long stroke positioning of the object table and the plurality of actuators.

18. The positioning assembly of claim 14, wherein the plurality of actuators comprises four electromagnetic.

19. The positioning assembly of claim 18, wherein the four electromagnetic actuators comprise two actuators configured to exert a force in a second direction onto the object table, the second direction being substantially perpendicular to the first direction, the two actuators being arranged on opposite sides of the substrate table, and two further actuators configured to exert a force in a third direction substantially perpendicular to the first and the second direction, the two further actuators being arranged on opposite sides of the object table.

20. A lithographic apparatus comprising:
- a support constructed to support a patterning device, the patterning device being capable of imparting a radiation beam with a pattern in its cross-section to form a patterned radiation beam;
- a substrate table constructed to hold a substrate on a central area of the substrate table;
- a projection system configured to project the patterned radiation beam onto a target portion of the substrate in a first direction; and
- a positioning device configured to position the substrate table, the positioning device comprising a plurality of actuators arranged to exert forces to position the substrate table, the forces generated by four of the plurality of actuators, arranged along four different sides of the substrate table, substantially being directed in a plane substantially perpendicular to the first direction, wherein the plurality of actuators are arranged outside a central volume of the substrate table, the central volume being obtained by projecting the central area along the first direction, and wherein the plurality of actuators are arranged along the four sides of the substrate table, wherein two different actuators of said plurality of actuators arranged along two adjacent sides of the substrate table are configured to exert a separate force in a same plane, and wherein two of the plurality of actuators arranged on two opposite sides of the substrate table are configured to exert a force in a same direction that passes substantially through a center of gravity of said substrate table and wherein another two of the plurality of actuators arranged on another two opposite sides of the substrate table are configured to exert forces along two different directions that are parallel to each other and that do not pass through the center of gravity.

* * * * *